US012117730B2

(12) United States Patent
Franke et al.

(10) Patent No.: US 12,117,730 B2
(45) Date of Patent: Oct. 15, 2024

(54) METHOD AND APPARATUS FOR PHOTOLITHOGRAPHIC IMAGING

(71) Applicant: ASML NETHERLANDS B.V., Veldhoven (NL)

(72) Inventors: Joern-Holger Franke, Ukkel (BE); Eric Henri Jan Hendrickx, Lubbeek (BE); Guido Constant Simon Schiffelers, Reusel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 542 days.

(21) Appl. No.: 17/606,647

(22) PCT Filed: Apr. 7, 2020

(86) PCT No.: PCT/EP2020/059826
§ 371 (c)(1),
(2) Date: Oct. 26, 2021

(87) PCT Pub. No.: WO2020/221556
PCT Pub. Date: Nov. 5, 2020

(65) Prior Publication Data
US 2022/0236645 A1 Jul. 28, 2022

(30) Foreign Application Priority Data

Apr. 30, 2019 (EP) .................................. 19171770
Mar. 20, 2020 (EP) .................................. 20164386

(51) Int. Cl.
*G03F 7/00* (2006.01)
(52) U.S. Cl.
CPC ...... *G03F 7/70125* (2013.01); *G03F 7/70116* (2013.01); *G03F 7/70516* (2013.01)
(58) Field of Classification Search
CPC ............. G03F 7/70125; G03F 7/70116; G03F 7/70516
USPC ......................................................... 430/30
See application file for complete search history.

(56) References Cited

U.S. PATENT DOCUMENTS

| | | | |
|---|---|---|---|
| 5,229,872 A | 7/1993 | Mumola | |
| 6,046,792 A | 4/2000 | Van Der Werf et al. | |
| 7,587,704 B2 | 9/2009 | Ye et al. | |
| 9,588,438 B2 | 3/2017 | Hsu et al. | |
| 2004/0137677 A1 | 7/2004 | Lowisch et al. | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2009/0262362 A1 | 10/2009 | de Groot et al. | |
| 2010/0162197 A1 | 6/2010 | Ye et al. | |
| 2010/0180251 A1 | 7/2010 | Ye et al. | |
| 2012/0075603 A1 | 3/2012 | Hansen et al. | |
| 2012/0077130 A1 | 3/2012 | Bagheri et al. | |
| 2012/0320358 A1 | 12/2012 | Ruoff | |
| 2017/0184979 A1 | 6/2017 | Hsu et al. | |
| 2017/0269480 A1 | 9/2017 | Finders | |
| 2017/0285483 A1 | 10/2017 | Finders | |

FOREIGN PATENT DOCUMENTS

| | | |
|---|---|---|
| EP | 1286218 | 2/2003 |
| JP | 2001267197 | 9/2001 |
| JP | 2004179663 | 6/2004 |
| JP | 2007520892 | 7/2007 |
| JP | 2012074695 | 4/2012 |
| JP | 2013524497 | 6/2013 |
| JP | 2017538155 | 12/2017 |
| TW | 200944950 | 11/2009 |

OTHER PUBLICATIONS

Sears, M.K et al.: "Lens wavefront compensation for 3D photomask effects in subwavelength optical lithography", Applied Optics, vol. 52, No. 3 (2013).
Japanese Office Action issued in corresponding Japanese Patent Application No. 2021-561848, dated Dec. 6, 2022.
International Search Report and Written Opinion issued in corresponding PCT Patent Application No. PCT/EP2020/059826, dated Jul. 20, 2020.
Timmermans, F.J. et al.: "Alternative absorber materials for mitigation of mask 3D effects in high NA EUV lithography", Proc. of SPIE, vol. 10775 (Sep. 19, 2018).
Last, T. et al.: "Experimental verification of AI decomposition-based source optimization for M1 two-bar building blocks in 0.33NA EUVL", Proc. of SPIE, vol. 9985 (Oct. 5, 2016).
Evanschitzky, P. et al.: "Compensation of mask induced aberrations by projector wavefront control", Proc. of SPIE, vol. 7973 (2011).
Erdmann, A. et al.: "Attenuated PSM for EUV: Can they mitigate 3D mask effects?", Proc. of SPIE, vol. 10583 (Mar. 19, 2018).

(Continued)

Primary Examiner — Christopher G Young
(74) Attorney, Agent, or Firm — Pillsbury Winthrop Shaw Pittman LLP

(57) ABSTRACT

A method for reducing M3D effects on imaging is described. The method includes identifying points within a source plane of the photolithography system that are associated with pattern shifts resulting from diffraction of light off a photomask under an angle of incidence between an imaging beam of radiation and the mask normal, determining pattern shifts associated with the identified source plane points, and modifying the source to reduce the determined pattern shifts.

20 Claims, 11 Drawing Sheets

(56) References Cited

OTHER PUBLICATIONS

Finders, J. et al.: "Illumination source optimization in EUV lithography for staggered contact holes and pillars for DRAM applications", Proc. of SPIE, vol. 10583 (May 2, 2018).
Finders, J. et al.: "EUV source optimization driven by fundamental diffraction considerations", Proc. of SPIE, vol. 10450 (Oct. 26, 2017).

METHOD AND APPARATUS FOR PHOTOLITHOGRAPHIC IMAGING

CROSS-REFERENCE TO RELATED APPLICATIONS

This application is the U.S. national phase entry of PCT Patent Application No. PCT/EP2020/059826 which was filed on Apr. 7, 2020, which claims the benefit of priority of European Patent Application No. 19171770.1 which was filed on Apr. 30, 2019 and of European Patent Application No. 20164386.3 which was filed on Mar. 20, 2020 which are incorporated herein in their entireties by reference.

TECHNICAL FIELD

The present description relates generally to photolithographic imaging. More particularly, apparatus, methods, and computer programs for reducing imaging errors due to three dimensional mask (M3D) effects are described.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"). This pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), and the reduction ratio can be different in x and y direction, the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method of optimizing a pattern for imaging a feature onto a substrate using a photolithography system, the method including identifying points within a source plane of the photolithography system that are associated with pattern shifts resulting from diffraction of light off a photomask due to asymmetric phase effects among diffraction orders, determining pattern shifts associated with the identified source plane points, and modifying the source to reduce the determined pattern shifts.

In an embodiment, the method includes determining, for the identified points, regions that pertain to each of a plurality of diffraction orders, separating the source to reduce overlap of the determined regions, determining a wavefront adjustment that will reduce the determined pattern shifts when applied to the source, and performing source mask optimization using the determined wavefront adjustment.

According to another embodiment, the method includes decomposing a source having a plurality of poles into a plurality of sources each having one pole, and selecting a pattern shift value for each of the plurality of sources.

The combination and sub-combinations of disclosed elements as described herein constitute separate embodiments. For example, selecting an aberration that produces asymmetric pattern shifts that are opposed to the determined pattern shift may be used in conjunction with eliminating points in the source plane, and/or using a modified source including a rotated dipole and using a rotated astigmatism. Each may be used together or separately. Likewise, the method may include a step of imaging onto a substrate or may end with the generation of an optimized pattern. Each described approach may optionally include the imaging step.

According to another embodiment, there is provided a computer program product comprising a non-transitory computer readable medium having instructions recorded thereon, the instructions when executed by a computer implementing the method described above.

DETAILED DESCRIPTION

Figure 1:
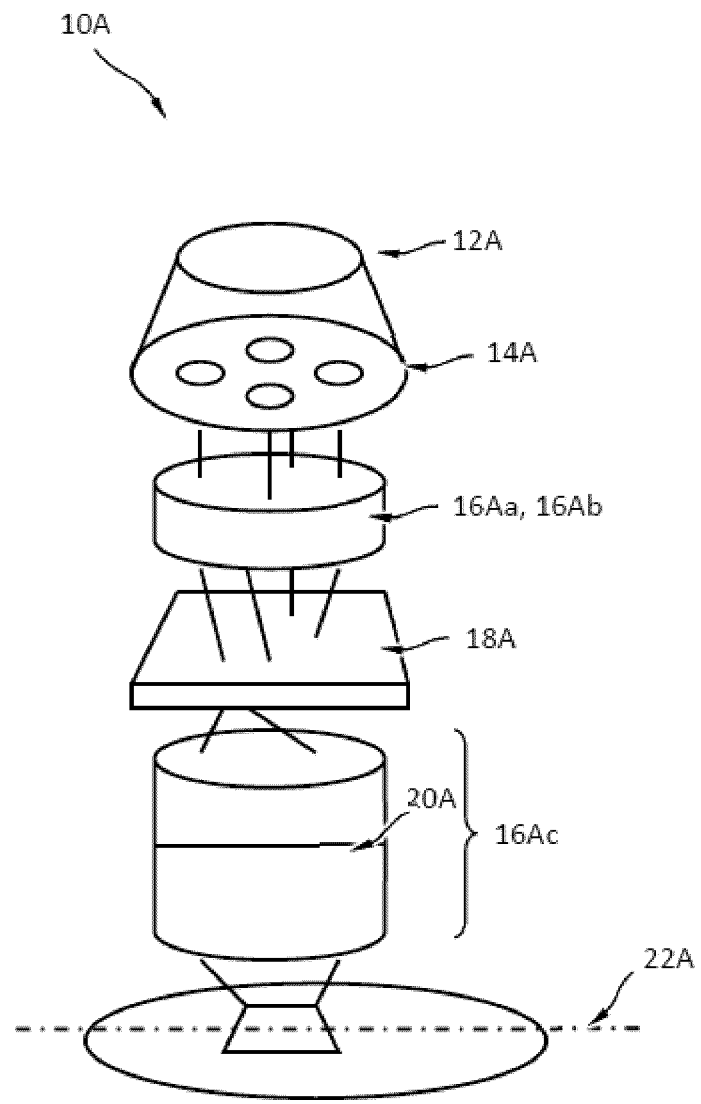
FIG. 1 shows a block diagram of various subsystems of a lithography system.

Continuing scaling of the dynamic random access memory storage node half pitch (DRAM SN HP) has led to smaller diffraction pattern overlap during lithography operations. Because of this smaller diffraction pattern overlap and/or other factors, typical diffraction pattern shaped pupils and post render pupils exhibit low illumination efficiency, which slows scanner throughput.

Although specific reference may be made in this text to the manufacture of ICs, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass EUV (extreme ultra-violet radiation, e.g. having a wavelength in the range of about 3-100 nm) radiation. However, other applications of the present method with other types of electromagnetic radiation, including ultraviolet radiation (e.g. with a wavelength of 365, 248, 193, 157 or 126 nm), is contemplated. Such radiation can in general have some degree of polarization.

A patterning device can comprise, or can form, one or more design layouts. The design layout can be generated utilizing CAD (computer-aided design) programs. This process is often referred to as EDA (electronic design automation). Most CAD programs follow a set of predetermined design rules in order to create functional design layouts/ patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask", "reticle" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be an extreme ultra violet (EUV) source or another type of source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device (or mask) 18A; and transmission optics 16Ac that project an image of the patterning device pattern onto a substrate plane 22A.

A pupil 20A can be included with transmission optics 16Ac. In some embodiments, there can be one or more pupils before and/or after mask 18A. As described in further detail herein, pupil 20A can provide patterning of the light that ultimately reaches substrate plane 22A. An adjustable filter or aperture at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), applying OPC using those techniques and models, and evaluating performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

The various optical components of the lithographic apparatus generally exhibit aberrations. Aberrated wavefronts can be described in terms of Zernike polynomials. Zernike polynomials are a set of orthogonal polynomials. They are an expansion of the wavefront function for an optical system that has a circular pupil. Because they are orthogonal, and because any arbitrary wavefront function can be described as a combination of Zernike polynomials (i.e., they are both orthogonal and complete) they constitute a basis set for describing the wavefront function. Among the Zernike polynomials, Z2/Z3 describe phase tilts that result in rigid pattern shifts irrespective of the feature to be printed, while higher order aberrations include, for example, Z5/Z6, which describe a rotated astigmatism as understood by the skilled artisan. It is also possible to describe aberrations in terms of other basis sets and lens models may make use of such basis sets in place of or in addition to Zernike descriptors. In particular, for certain optical designs that include a central obscuration, the Zernike polynomials become non-orthogonal, and therefore poorly suited to describing optical aberrations and other basis sets are required.

In a typical photolithography machine, adjustment knobs (which may be actual or virtual control knobs), are available to modify various machine parameters. Among other parameters, aberration in terms of Zernike polynomials may be modified using the knobs. The knobs form a part of the control system of the lithographic apparatus, and may be implemented in computer software, for example.

Using the knobs, the wavefront can be modified, and in an embodiment, a particular Zernike polynomial or polynomials may be selected to be modified to improve the imaging performance Each control knob may affect the values of one or more Zernike polynomials, so an adjustment of a specific Zernike polynomial may require manipulation of one or more knobs. In principle, the knob may alter the position and/or orientation of one or more optical elements (mirrors in a catoptric system, or lenses in a dioptric system, or a combination in a catadioptric system). It is known to provide knobs for controlling Z5 and Z6, for example. The adjustments can be characterized in terms of a fraction of the wavelength of the imaging light. For example, an adjustment to Z6 may be −70 mλ, which means that the induced phase shift is 0.070 times the imaging wavelength.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, with each pixel having values (e.g., within a range [−255, 255], normalized values within a range [0, 1] or [−1, 1] or other appropriate ranges).

The thin-mask approximation, e.g., the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Additionally, to the extent that the imaging radiation is partially or completely polarized, polarization effects can become relevant, in particular at high NA (e.g., NA>0.33). Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

Figure 2:
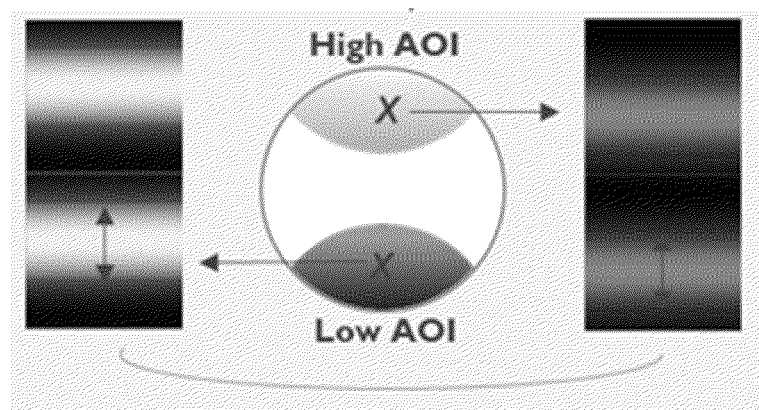
FIG. 2 illustrates an effect of angle of incidence on imaging performance

In EUV imaging in particular, largely unwanted and uncontrolled phase modulation of the diffracted orders takes place. This modulation shows a strong correlation to incidence angle and becomes more severe due to the off-axis incidence of the chief ray angle inherent in EUV imaging. This leads to relative pattern shifts of images coming from different regions of the source (i.e. generated by different incidence angles of EUV light on the mask) against one another. Since these images are superimposed incoherently, image contrast (or NILS) suffers as a result. Increasing NILS tends to widen the process window and reduce line width roughness (LWR) and stochastic defects. This is illustrated in FIG. 2, which shows an example of a pattern shift due to capture of the different diffraction orders.

As a general rule, we observe that high angle of incidence light (the aerial image from the upper pole) results in a downward shift in the image for a dense L/S grating. The lower pole (low angle of incidence light) causes an upward shift. As described above, because the image in the resist is a summation over all of the source, the total contrast is lowered due to this effect. Similar pole-specific shifts are observed for dense contact hole arrays of different geometry. In principle, there may be different patterns that show the opposite effects such that the aerial image from the upper pole is shifted upward while the image from the lower pole is shifted downward. As will be described in further detail below, by optimizing the source, this effect can be reduced, helping to improve contrast.

Figure 3:
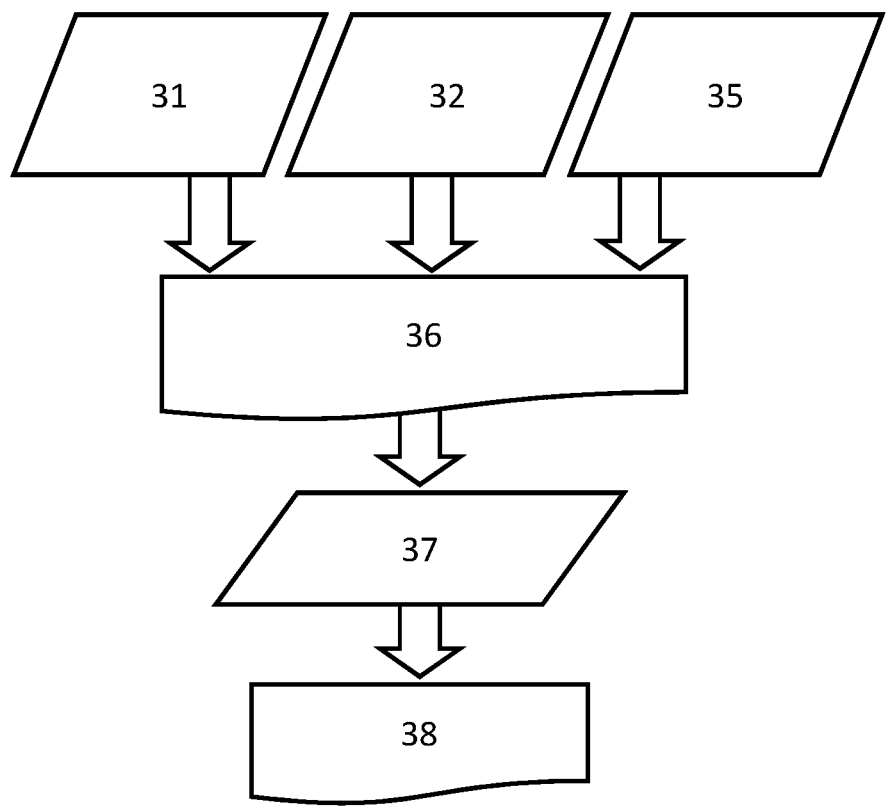
FIG. 3 is flow chart of a method for determining a patterning device pattern or a target pattern to be printed on a substrate, according to an embodiment.

FIG. 3 is an exemplary flow chart for simulating lithography in a lithographic projection apparatus. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Stochastic variations of the patterning process (e.g., resist process) potentially limits lithography (e.g., EUV lithography), for example, in terms of shrink potential of features and exposure-dose specification, which in turn affects wafer throughput of the patterning process. In an embodiment, stochastic variations of a resist layer may manifest in stochastic failures such as closed holes or trenches, or broken lines. Such resist related stochastic variations impact and limit successful high volume manufacturing (HVM) more than compared to, for example, stochastic CD variation, which is a traditional metric of interest to measure and adjust performance of the patterning process.

In patterning processes (e.g., photolithography, electron beam lithography, etc.), an energy sensitive material (e.g., photoresist) deposited on a substrate undergoes a pattern transfer step (e.g., light exposure). Following the pattern transfer step, various post steps such as resist baking, and subtractive processes such as resist development, etches, etc. are applied. These post-exposure steps or processes exert various effects, causing the patterned layer or etched substrate to form structures having dimensions different from targeted dimensions.

In computational lithography, patterning process models (e.g., discussed in FIG. 2) related to different aspects of the patterning process such as a mask model, an optical model, resist model, post-exposure models, etc. may be employed to predict a pattern that will be printed on the substrate. The patterning process models when properly calibrated (e.g., using measurement data associated with a printed wafer) can produce accurate prediction of patterns dimensions output from the patterning processes. For example, a patterning process model of post-exposure processes is calibrated based on empirical measurements. The calibration process involves exposing test substrates by varying different process parameters (e.g., dose, focus, etc.), measuring resulting critical dimensions printed patterns after post-exposure processes, and calibrating the patterning process model to the measured results. In practice, fast and accurate models serve to improve device performance (e.g., yield), enhance process windows, patterning recipes, and/or increase complexity of design pattern.

In an embodiment, the process may involve obtaining an initial image (e.g., a CTM image or an optimized CTM image, or a binary mask image). In an embodiment, the initial image may be a CTM image generated by a CTM generation process based on a target pattern to be printed on a substrate. The CTM image may then be received by the process. In an embodiment, the process may be configured to generate a CTM image. For example, in a CTM generation technique, an inverse lithography problem is formulated as an optimization problem. The variables are related to values of pixels in a mask image, and lithography metric such as EPE or sidelobe printings are used as cost function. In an iteration of the optimization, the mask image is constructed from the variables and then a process model is applied to obtain optical or resist images and cost functions are computed. The cost computation then gives the gradient values that are used in the optimization solver to update variables (e.g., pixel intensities). After several iterations during optimization, a final mask image is generated, which is further used as guidance map for pattern extraction (e.g., as implemented in a SMO process). Such an initial image (e.g., the CTM image) may include one or more features (e.g., a feature of a target pattern, SRAFs, SRIFs, etc.) corresponding to the target pattern to be printed on the substrate via the patterning process.

An example of a typical source mask optimization process is described in U.S. Pat. No. 9,588,438 titled "Optimization Flows of Source, Mask and Projection Optics", which is incorporated in its entirety by reference. Source mask optimization may account for imaging variation across multiple positions of a mask design layout. The design layout may comprise one or more of an entire design layout, a clip, or one or more critical features of the design layout, and/or other layouts. For example, the design layout may be a set of clips that is selected by a pattern selection method based on diffraction signature analysis or any other method. Alternatively, a full chip simulation may be performed, 'hot spots' and/or 'warm spots' may be identified from the full chip simulation, and then a pattern selection step is performed.

Simulating lithography for a lithographic projection apparatus may utilize a source model that represents optical characteristics (including light intensity distribution and/or phase distribution) of the source, a projection optics model that represents optical characteristics (including changes to the light intensity distribution and/or the phase distribution caused by the projection optics) of the projection optics (in some embodiments, the source model and the projection optics model can be combined into a transmission cross coefficient (TCC) model), a design layout model that represents optical characteristics (including changes to the light intensity distribution and/or the phase distribution caused by a given design layout) of a design layout, which is the representation of an arrangement of features on a mask, and/or other models. An aerial image can be simulated from the transmission cross coefficient and the design layout model. A resist image can be simulated from the aerial image using a resist model. Simulation of lithography can, for example, predict contours and CDs in the resist image.

In an embodiment, the source model can represent the optical characteristics of the source that include, but are not limited to, NA-sigma ($\sigma$) settings as well as any particular illumination source shape (e.g. off-axis light sources such as annular, quadrupole, and dipole, etc.). The projection optics model can represent the optical characteristics of the of the projection optics that include aberration, distortion, refractive indexes, physical sizes, physical dimensions, etc. The design layout model can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or another file format.

Figure 4:
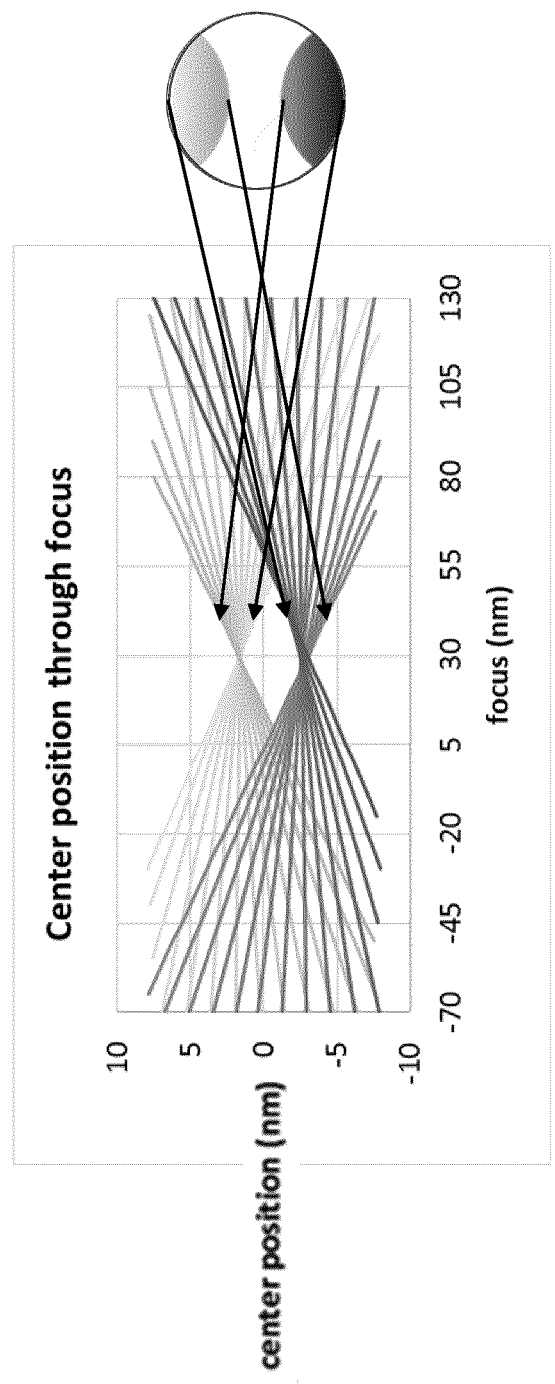
FIG. 4 illustrates a shift in center position of an image due to M3D effects.

FIG. 4 illustrates the same concept as is shown in FIG. 2, with high angle of incidence light being shifted downward and low angle of incidence light being shifted upward, leading to a mismatch in the center position. In the example, the center position of the high and low angle of incidence light is offset at a focal plane by approximately 5 nm.

Figure 5:
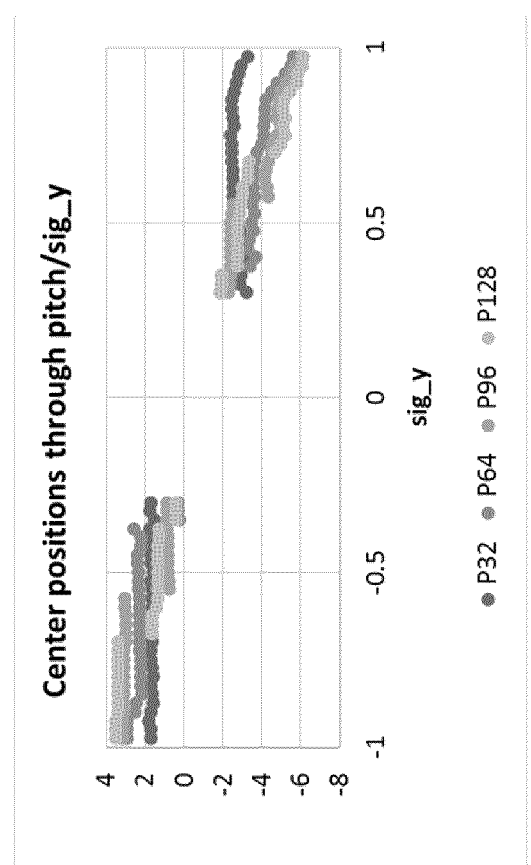
FIG. 5 illustrates position shift due to M3D effects for different pitches.

Similarly, FIG. 5 illustrates center offsets though pitch. The relationship is plotted for pitches of 32, 64, 96, and 128 nm. For each pitch, the same reversal of offset direction is observed. That is, once again, the center positions of the lower angle of incidence (shown on the left of the graph) are shifted upward, while the center positions of the higher angle of incidence source (right side of the graph) points are shifted downward. The necessary corrections are therefore in the opposite directions.

Figure 6:
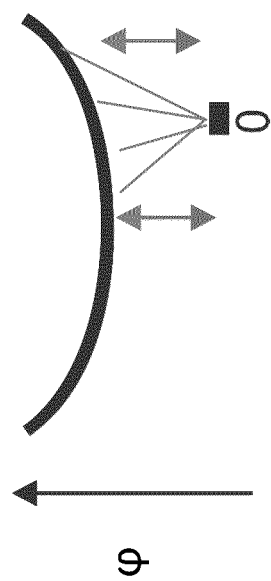
FIG. 6 shows a phase offset between zeroth and diffracted orders.

Given this observation, it can be deduced that the phase deltas are of opposite sign, which corresponds to a $0^{th}$ order offset being the primary phase offset that is affecting the imaging. This is shown in FIG. 6, in which the phase curve is dominated by a $0^{th}$ order offset.

One approach to correcting the offset then would be to introduce different linear phase shifts to different source points. For example, an adjustment to Z3 to the aerial image from the lower pole could move the center position downward, while a similar, but opposite in sign, adjustment to the aerial image from the upper pole to move its center position upward would provide appropriate correction. The source must therefore be modified in such a way as to make these opposite corrections for different poles.

Figure 7:
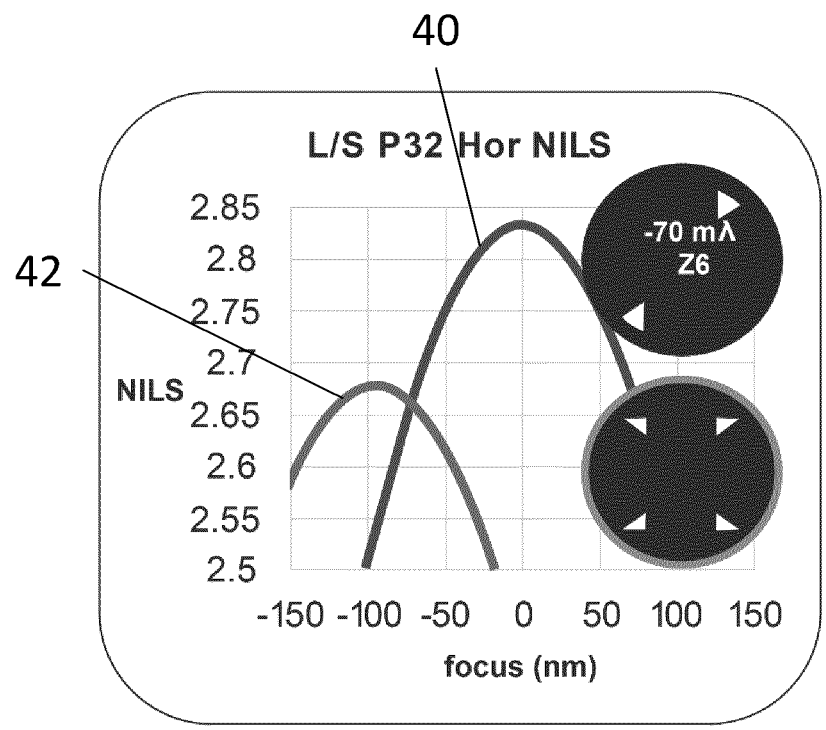
FIG. 7 compares imaging performance for a four pole image and a two pole image with added aberration in accordance with an embodiment of the invention.
Figure 8:
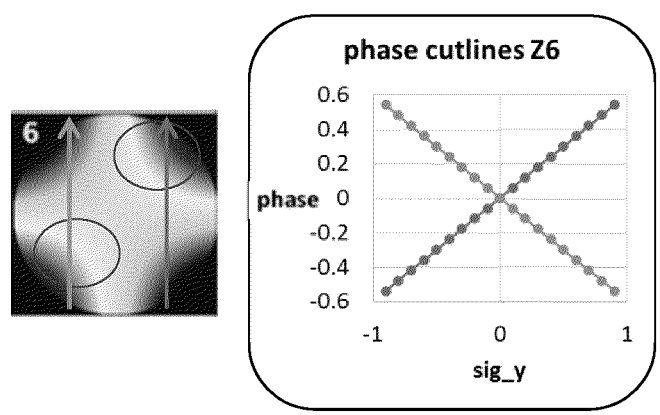
FIG. 8 illustrates an example of an injected phase difference for a decoupled diffraction pattern in accordance with an embodiment of the invention.
Figure 9A:
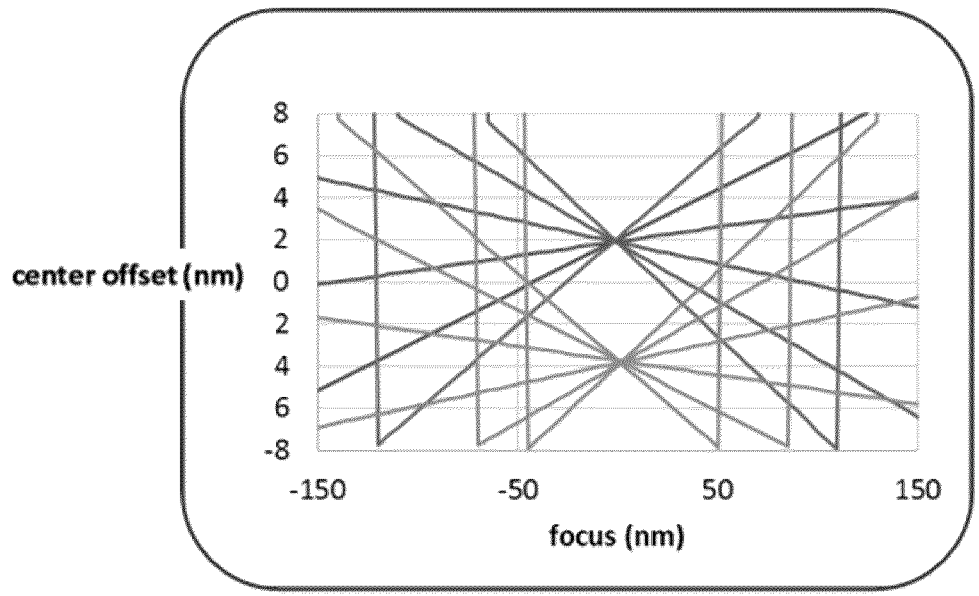
FIGS. 9A and 9B illustrate a reduced center position shift produced in accordance with an embodiment of the invention.
Figure 9B:
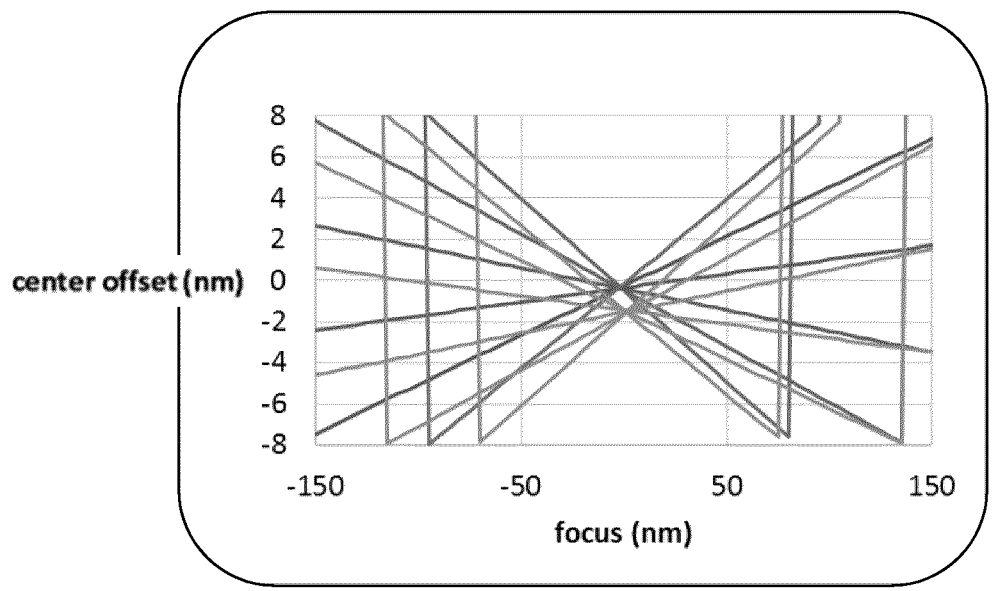

FIG. 7 illustrates the effect of introducing an asymmetry to the source, along with the addition of an adjustment to Z6. In the example, horizontal lines and spaces are to be imaged. Diffraction orders of the horizontal lines fall on a vertical cutline, as shown in FIG. 8, and therefore have a linear phase tilt. The upper right pole and the lower left pole (circles in FIG. 8) experience a tilt of opposite sign, shifting the pattern in the opposite direction. The darker line 40 of FIG. 7 represents a simulated NILS for the adjusted source while the lighter line 42 represents the initial NILS. As can be clearly seen, there is a significant improvement in NILS as a result of the change in source geometry by removal of the lower right and upper left poles in addition to the application of Z6 aberration adjustments FIGS. 9A and 9B show the same adjustment as measured in terms of center offset. As is clear from FIG. 9B, the shifts due to M3D are largely cancelled by the application of the same Z6 adjustment of −70 m.

Figure 10:
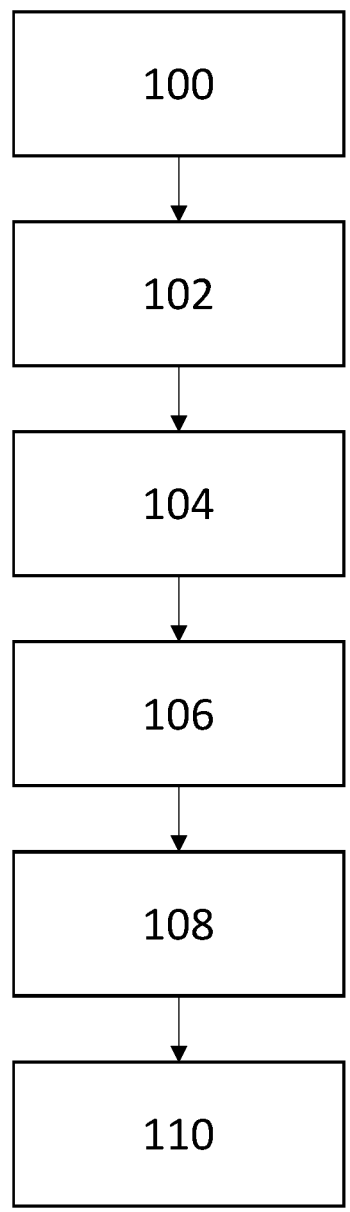
FIG. 10 is a flowchart showing a workflow in accordance with an embodiment of the invention.

FIG. 10 is a flowchart illustrating a method for compensating M3D induced pattern shifts in accordance with an embodiment. Step 100 includes identifying points within a source plane of the photolithography system that are important to the imaging. This may be done, for example, by looking at NILS, MEEF (Mask Error Enhancement Factor), or depth of focus information. The skilled artisan understands mask error enhancement factor to be a measurement of the amount by which an error on a mask is amplified in the aerial image. That is, while errors on the mask could be expected to be imaged at one fourth size due to the imaging demagnification, it is often the case that the error in the aerial image is larger than one fourth the size of the mask error. As a general rule, MEEF exceeds one, and tends to be larger as feature sizes shrink. This is because MEEF is dependent on diffraction effects, which dominate as image scale is decreased.

As will be appreciated, particular parts of a source plane may be more or less important to the overall imaging, depending on, for example, the pattern being imaged, the resolution of various portions of the image, and other factors. In an embodiment, this determination is made at a selected defocus value that minimizes the pattern shift between the poles.

Next, step 102 includes identifying pattern shifts for the identified points. In particular, as described above, such pattern shifts result from diffraction of light off of the photomask under an angle of incidence between an imaging beam of radiation and the mask normal (M3D effects).

Step 104 is to determine, for the identified points, regions that pertain to each of a plurality of diffraction orders and separate the source to reduce overlap of the determined regions. This may be done, for example, in simulation of the pupil plane. While in principle, it would be desirable to entirely eliminate overlap, this often is not practicable, so that a reduction is the best achievable result.

In one example, for horizontal line/space pattern the upper left quadrant and the lower right quadrant can be removed to leave two poles at the upper right and lower left (as shown in FIG. 7). A similar approach can be applied to dense contact holes, for which simulations similarly show improved NILS by application of Z6 aberrations. However, because dense contact holes have significant overlapping diffraction orders, it is more difficult to get a complete separation between source points. In practice, the method may still be applied despite being unable to completely remove overlaps. For example, in dense line imaging, even if the majority of the pattern can be treated as one dimensional, the line ends produce 2D effects, making some diffraction order overlap difficult or impossible to eliminate. Nevertheless, these effects tend to be small and there are still potential benefits as applied to the regular portions of the pattern.

Optionally, when determining portions of the source to remove, those pixels that are most polarization-dependent and therefore tend to contribute significantly to polarization related errors could similarly be cut out.

Step 106 is to determine a wavefront that will reduce the determined pattern shifts when applied to the source. For each pupil area (in principle, for each pixel), a phase can be determined that would produce the appropriate shift, particularly where the shifts are linear as in the examples above. In this way, a desired wavefront that would correct the pattern shifts can be obtained. This wavefront adjustment can be described in terms of a Zernike polynomial as in the above examples, but might also be more complicated. Once determined, the capabilities of the scanner to actually produce that wavefront should be examined, for example using a lens model.

To the extent that the scanner is able to produce the determined wavefront adjustment for portions of the source and not for others, optionally, step 108 is to remove source parts for which it is difficult to compensate the phase. Further optionally, if it is sufficiently difficult to compensate the phase, and source parts cannot be removed to simplify that operation, then a change in focus can be set and the method returns to step 102 to again determine pattern shifts for each source point.

In one approach to determining whether a particular wavefront may be produced, a first step is to calculate what each Zernike of a plurality of Zernikes (e.g. Z5-Z20) can produce in terms of phase shifts for the source points left after source decomposition. Then, the source points may be ranked by a difference between desired and obtained phase shifts. The lowest ranked points are then dropped until a threshold metric is achieved. For example, using pupil fill ratio as the threshold, i.e., the proportion of the pupil that is bright vs. dark, a minimum number of source pixels is reached. That is, a minimum allowable pupil fill ratio is specified, and source points are dropped until that ratio is reached. If all low ranked points are eliminated before the threshold pupil fill ratio is reached, then optionally, no additional points need to be dropped.

Alternatively a threshold could be set in terms of net pattern shift left, above which source points are dropped. Then, the results are compared for all of the Zernikes and a best compensated wavefront is chosen from among them. In an alternate approach, rather than using Zernikes in the first step, a lens model could be used to try to solve for a phase front closest to what is needed (i.e., use a best combination of those aberrations for which a knob is available to make adjustments—inducible aberrations) prior to proceeding with ranking of the remaining source points.

Finally, step 110 is to perform source mask optimization using the determined wavefront.

The disclosed method is robust through pitch for patterns that are predominantly H/V, including, for example, overlay markers. That is, as pitch is varied, the method continues to show good performance for this type of feature.

Figure 11:
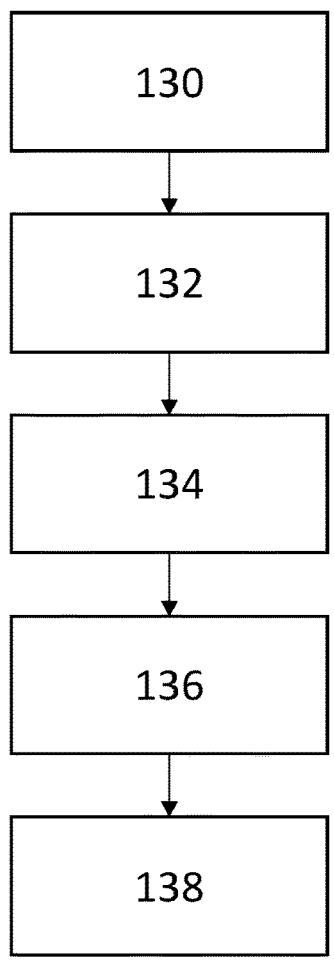
FIG. 11 is a flowchart showing a workflow in accordance with an embodiment of the invention.

FIG. 11 is a flowchart illustrating a second embodiment of a method for compensating M3D induced pattern shifts. As in FIG. 10, the first step 130 is to identify points within the source plane that are important to the imaging. Likewise, the second step 132 is to identify pattern shifts for the identified points.

At step 134, the methods diverge, and the pattern shifts are "binned," for example, per pole, so that the source can be decomposed into single exposure sources. Thus, rather than eliminating poles that create overlap, overlapping poles are separated into different exposures.

At step 136, a source and mask are optimized for each of the different partial sources that have been created at the preceding step. Because the masks and sources are separated, the SMO operation can be run to optimize a bias for each of the separate imaging operations, which allows for the same type of opposed bias for upper and lower poles that were made in the previous embodiment.

At step 138, the imaging operation is performed using a multiple exposure technique, with each optimized mask and source combination, such that the appropriate biases are applied to each pole's contribution to the final image. There is some cost to throughput to this approach, but the improvement in NILS may have value in particularly exacting imaging operations.

In an embodiment, steps 136 and 138 may be performed using only a single mask. That is, during the optimization, two different sources are generated, but a common mask is optimized. The shift is then accounted for by shifting the wafer between exposures to obtain the corrective effect. That is, the wafer may be moved in X and Y to account for the overlay differences due to the image shift. Likewise, it may optionally be moved in Z to account for focus changes. In this manner, the sub images are made to overlap in an optimal manner.

Because this embodiment makes use of multiple imaging steps, it may incorporate a "vote taking" approach to imaging. In vote taking, N mask images are each exposed with a fractional (1/N) dose. That is, a plurality of images are stacked one on another, using separate mask patterns. Because each mask has its own randomized defects, the stacking of images reduces the effects of each, and the result is that mask defect effects tend to be diminished.

In a vote taking scheme, the work flow can be as follows. Expose one lot of wafers with a first reticle at dose 1/N; swap reticles and expose the lot with a second reticle, repeat for N reticles, then proceed to post-exposure bake. While an alternate approach to vote-taking involves a single reticle with a repeated pattern that is imaged in overlapping fashion, it will be apparent that a vote taking imaging using separately optimized masks per pole is not generally suited to single reticle vote taking. On the other hand, a single reticle having separate dies that are optimized per pole could in theory be used in a vote taking imaging process.

Figure 12:
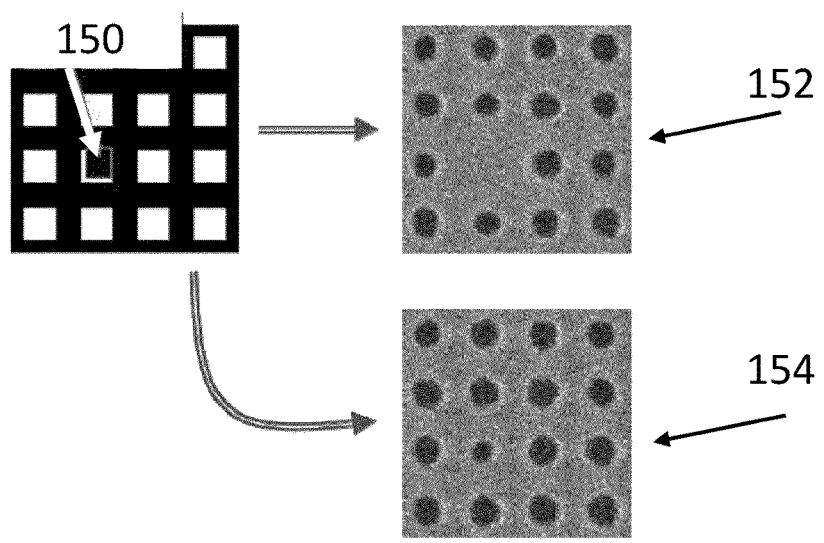
FIG. 12 is an illustration showing an effect of imaging using a vote taking scheme.

FIG. 12 illustrates the effect of vote taking in mitigating a defect 150. In this case, the defect is a dark defect (i.e., a portion of the image that should be illuminated is not). Image 152 is the resulting image from using the defective reticle at full dose. In contrast, image 154 is the image produced by the defective reticle at ¼ dose, along with three other (presumably non-defective) reticles at ¼ dose each. Thus, the contact hole at the position of the dark defect, while not perfectly rendered, is still present, unlike in image 152.

In an embodiment, the method further comprises generating machine readable instructions that can be used for performing the methods. This may include generating the machine readable instructions based on programming code drafted by a user, writing the instructions to a storage device (e.g., a non-transitory storage device), storing the instructions on a server, and/or other operations. The machine readable instructions may comprise lines of code, databases, and/or other arrangements of information stored in files and/or in other electronic formats. These examples are not intended to be limiting.

Figure 13:
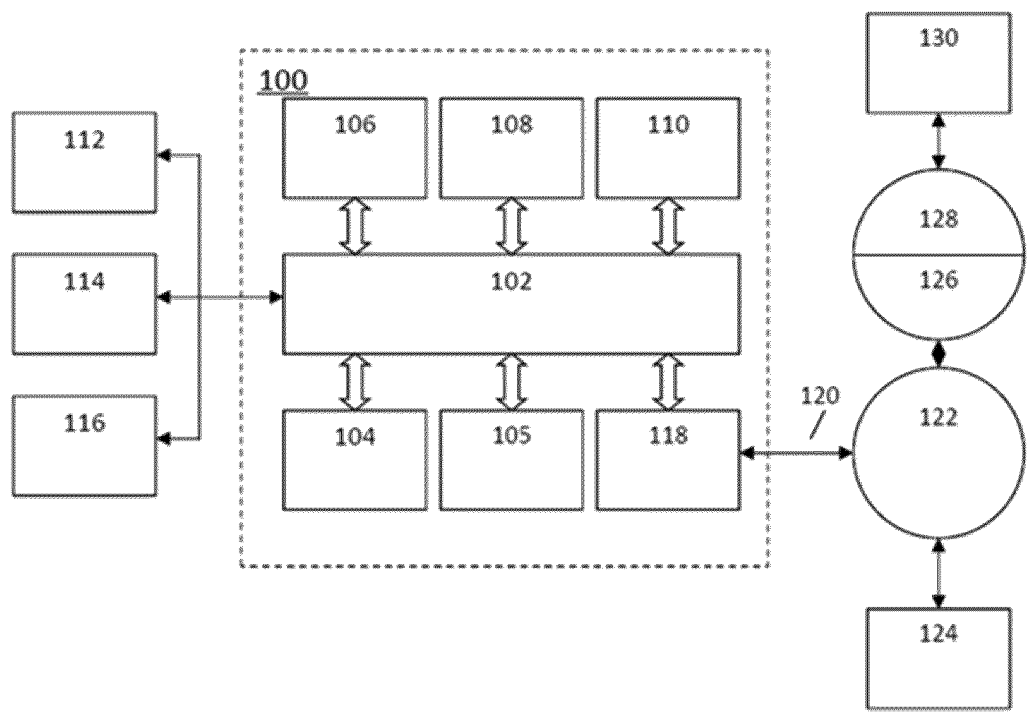
FIG. 13 is a schematic diagram of a computing system for use in the method, workflows or in the operation of apparatus in accordance with various embodiments of the invention.

FIG. 13 is a block diagram that illustrates a computer system 100 that can assist in implementing the methods, flows, or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer (e.g., a server and/or other computing devices), a solid-state storage device, and/or in other locations. The remote computer can load the instructions into its dynamic memory and send the instructions over a wireless communication network (e.g., the internet, a cellular communications network, etc.), through a telephone line using a modem, and/or by other methods. A modem and/or other data receiving components local to computer system 100 can receive the data via the wireless communication network, on the telephone line, etc., and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 14:
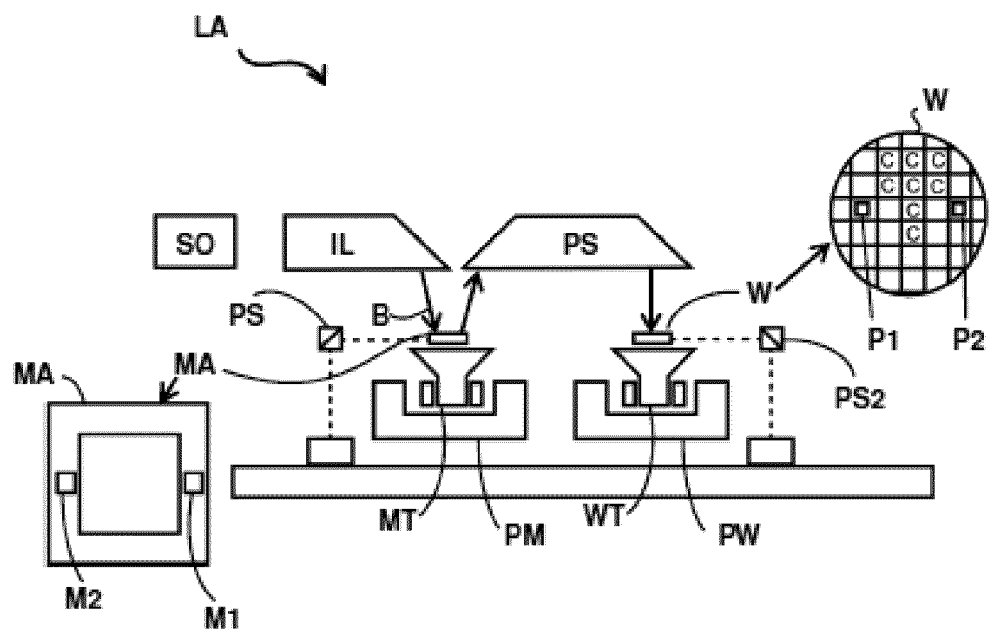
FIG. 14 is a schematic diagram of a lithographic projection apparatus, according to an embodiment.

FIG. 14 schematically depicts an exemplary lithographic projection apparatus that can be utilized in conjunction with the techniques described herein.

The lithographic projection apparatus comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C1 (e.g. comprising one or more dies) of the substrate W.

As depicted in FIG. 14, the apparatus is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source. In an embodiment, a DUV laser source may be used.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

In step mode, the support structure (e.g. patterning device table) MT and the substrate table WT are kept essentially stationary, while an entire pattern imparted to the radiation beam is projected onto a target portion C1 at one time (i.e. a single static exposure). The substrate table WT is then shifted in the X and/or Y direction so that a different target portion C1 can be exposed.

In scan mode, the support structure (e.g. patterning device table) MT and the substrate table WT are scanned synchronously while a pattern imparted to the radiation beam is projected onto a target portion C1 (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C1. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 15:
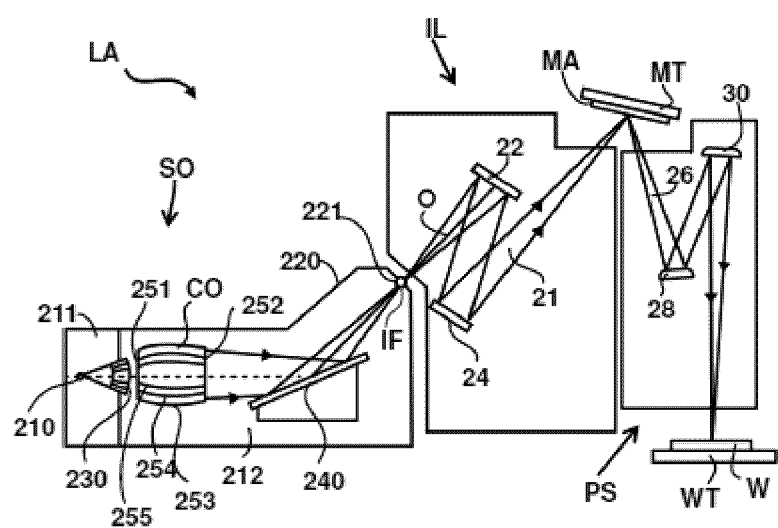
FIG. 15 is a more detailed view of the apparatus in FIG. 14, according to an embodiment.

FIG. 15 shows the apparatus in more detail, including the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source (and/or other sources as described above). EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-10 or more additional reflective elements present in the projection system PS than shown in FIG. 10.

Collector optic CO, as further illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Alternatively, the source collector module SO may be part of an LPP radiation system (not shown). In this approach, a laser is arranged to deposit laser energy into a fuel, such as xenon (Xe), tin (Sn) or lithium (Li), creating a highly ionized plasma with electron temperatures of several 10's of eV. The energetic radiation generated during de-excitation and recombination of these ions is emitted from the plasma, collected by a near normal incidence collector optic and focused onto an opening in the enclosing structure.

The embodiments may further be described using the following clauses:

1. A method of optimizing a pattern for imaging a feature onto a substrate using a photolithography system, the method comprising:
   identifying points within a source plane of the photolithography system that are associated with pattern shifts resulting from diffraction of light off a photomask due to asymmetric phase effects among diffraction orders;
   determining pattern shifts associated with the identified source plane points; and modifying the source to reduce the determined pattern shifts.
2. The method as in clause 1, wherein the modifying comprises: determining, for the identified points, regions that pertain to each of a plurality of diffraction orders; separating the source to reduce overlap of the determined regions; determining a wavefront adjustment that will reduce the determined pattern shifts when applied to the source; and performing source mask optimization using the determined wavefront adjustment.
3. The method as in clause 2, wherein the separating the source comprises separating 1D diffraction orders while allowing 2D diffraction orders to overlap.
4. The method as in clause 2, wherein the determining the aberration comprises selecting an aberration that produces asymmetric pattern shifts that are opposed to the determined pattern shift given by the diffraction of the mask.
5. The method as in clause 2, further comprising, eliminating points in the source plane wherein the determined aberration cannot be produced within a selected tolerance threshold.
6. The method as in clause 2, wherein the modified source comprises a rotated dipole and the determined aberration is an appropriately rotated astigmatism.
7. The method as in clause 2, wherein the modified source is a trimmed leaf-shaped dipole and the determined aberration is a rotated astigmatism.
8. The method as in clause 7, wherein the rotated astigmatism is described by Z6.
9. The method as in clause 1, wherein the modifying comprises:
   decomposing a source having a plurality of poles into a plurality of sources each having one pole; and
   selecting a pattern shift value for each of the plurality of sources.
10. The method as in clause 9, further comprising, selecting a proportion of a total imaging dose to be assigned to each of the plurality of sources.
11. The method as in clause 9, wherein the plurality of sources comprise a pair of opposed poles and wherein the selected pattern shift for one pole from the pair of opposed poles is in a direction opposite to a selected pattern shift for the other pole from the pair of opposed poles.
12. The method as in clause 9, wherein the plurality of sources comprises two or more poles, wherein the poles may be grouped into two or more sets, wherein for each set, the selected pattern shift is different from each other set.
13. The method as in clause 9, further comprising, imaging using a vote taking imaging procedure.
14. The method as in clause 13, wherein the vote taking imaging comprises performing each exposure with one or more of: shifted images from a same region of a single mask, from shifted areas from a single mask, or from different masks.
15. The method as in clause 1, wherein the identifying comprises single source point scanning and comparing a figure of merit of simulated image quality.
16. The method as in clause 15, wherein the figure of merit comprises one or more of: normalized image log slope, depth of focus, and mask error enhancement function.
17. The method as in clause 1, wherein the photolithography system is an EUV system.
18. The method as in clause 1, wherein the pattern shifts result from mask 3D effects.
19. The method as in clause 1, wherein the pattern shifts are asymmetrical relative to the identified points within the source plane.
20. The method as in clause 1, wherein the method further comprises using induced apodization to reduce amplitude of selected diffraction orders.
21. The method as in clause 1, further comprising, imaging the feature onto the substrate.
22. A non-transitory computer readable storage medium comprising instructions which when executed by a processor cause the processor to perform the method as in any of clauses 1-21.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
   identifying points within an illumination plane of a photolithography system that are associated with pattern shifts resulting from diffraction of radiation off a patterning device due to asymmetric phase effects among diffraction orders;

determining shifts, associated with the identified points, of a pattern for imaging a feature onto a substrate using the photolithography system; and modifying the illumination to reduce the determined pattern shifts.

2. The method as in claim 1, wherein the modifying comprises:

determining, for the identified points, regions that pertain to each of a plurality of diffraction orders;

separating the illumination to reduce overlap of the determined regions;

determining a wavefront adjustment that will reduce the determined pattern shifts when applied to the illumination; and performing source mask optimization using the determined wavefront adjustment.

3. The method as in claim 2, wherein the separating the illumination comprises separating 1D diffraction orders while allowing 2D diffraction orders to overlap.

4. The method as in claim 2, wherein the determining the wavefront adjustment comprises selecting an aberration that produces asymmetric pattern shifts that are opposed to the determined pattern shifts given by the diffraction of the patterning device.

5. The method as in claim 2, further comprising eliminating points in the illumination source plane wherein the determined wavefront adjustment cannot be produced within a selected tolerance threshold.

6. The method as in claim 2, wherein the modified illumination comprises a rotated dipole and the determined wavefront adjustment is an appropriately rotated astigmatism.

7. The method as in claim 2, wherein the modified illumination is a trimmed leaf-shaped dipole and the determined wavefront adjustment is a rotated astigmatism.

8. The method as in claim 1, wherein the modifying comprises:

decomposing an illumination source having a plurality of poles into a plurality of illumination shapes each having one pole; and selecting a pattern shift value for each of the plurality of illumination shapes.

9. The method as in claim 8, further comprising selecting a proportion of a total imaging dose to be assigned to each of the plurality of illumination shapes.

10. The method as in claim 8, wherein the plurality of illumination shapes comprise a pair of opposed poles and wherein the selected pattern shift for one pole from the pair of opposed poles is in a direction opposite to a selected pattern shift for the other pole from the pair of opposed poles.

11. The method as in claim 8, wherein the plurality of illumination shapes comprises two or more poles, wherein the poles may be grouped into two or more sets, wherein for each set, the selected pattern shift is different from each other set.

12. The method as in claim 8, further comprising imaging using a vote taking imaging procedure.

13. The method as in claim 1, wherein the identifying comprises single illumination point scanning and comparing a figure of merit of simulated image quality.

14. The method as in claim 1, wherein the pattern shifts result from mask 3D effects, and/or wherein the pattern shifts are asymmetrical relative to the identified points.

15. The method as in claim 1, further comprising using induced apodization to reduce amplitude of selected diffraction orders.

16. A non-transitory computer-readable storage medium comprising instructions therein, the instructions, when executed by a processor system, are configured to cause the processor system to a least:

identify points within an illumination plane of a photolithography system that are associated with pattern shifts resulting from diffraction of radiation off a patterning device due to asymmetric phase effects among diffraction orders;

determine shifts, associated with the identified points, of a pattern for imaging a feature onto a substrate using the photolithography system; and modify the illumination to reduce the determined pattern shifts.

17. The medium of claim 16, wherein the instructions configured to cause the processor system to modify the illumination are further configured to cause the processor system to:

determine, for the identified points, regions that pertain to each of a plurality of diffraction orders;

separate the illumination to reduce overlap of the determined regions;

determine a wavefront adjustment that will reduce the determined pattern shifts when applied to the illumination; and perform source mask optimization using the determined wavefront adjustment.

18. The medium of claim 16, wherein the instructions configured to cause the processor system to modify the illumination are further configured to cause the processor system to:

decompose an illumination shape having a plurality of poles into a plurality of illumination shapes each having one pole; and select a pattern shift value for each of the plurality of illumination shapes.

19. The medium of claim 16, wherein the pattern shifts result from mask 3D effects, and/or wherein the pattern shifts are asymmetrical relative to the identified points.

20. The medium of claim 16, wherein the instructions are further configured to cause the processor system to use induced apodization to reduce amplitude of selected diffraction orders.

* * * * *